United States Patent [19]

Ondris

[11] Patent Number: 4,826,777
[45] Date of Patent: May 2, 1989

[54] MAKING A PHOTORESPONSIVE ARRAY

[75] Inventor: Miroslav Ondris, Chagrin Falls, Ohio

[73] Assignee: The Standard Oil Company, Cleveland, Ohio

[21] Appl. No.: 224,841

[22] Filed: Jul. 26, 1988

Related U.S. Application Data

[62] Division of Ser. No. 40,532, Apr. 17, 1987, Pat. No. 4,785,191.

[51] Int. Cl.[4] ............................................. H01L 27/14
[52] U.S. Cl. .............................................. 437/2; 437/3; 357/30; 250/211 J
[58] Field of Search ..................... 357/32, 30 P, 30 H, 357/30 G, 30 Q; 437/2, 3; 250/211 J, 211 R

[56] References Cited

U.S. PATENT DOCUMENTS

| | | | |
|---|---|---|---|
| 3,432,670 | 3/1969 | Dym | 250/211 |
| 3,448,275 | 6/1969 | Hall | 250/209 |
| 3,480,830 | 11/1969 | Horton et al. | 315/169 |
| 4,162,570 | 7/1979 | Fischer | 357/30 Q |
| 4,240,842 | 12/1980 | Lindmayer | 437/2 |
| 4,282,541 | 8/1981 | Tsang | 357/16 |
| 4,320,251 | 3/1982 | Naragimhan et al. | 357/30 Q |
| 4,347,526 | 8/1982 | Elliott | 357/55 |
| 4,499,384 | 2/1985 | Segawa et al. | 250/211 J |
| 4,535,195 | 8/1985 | Morimoto et al. | 357/16 |
| 4,543,442 | 9/1985 | Alcorn et al. | 357/15 |
| 4,565,928 | 1/1986 | Yamamoto et al. | 250/578 |
| 4,675,739 | 6/1987 | Catchpole et al. | 250/213.11 |

FOREIGN PATENT DOCUMENTS

| | | |
|---|---|---|
| 0214033 | 3/1987 | European Pat. Off. . |
| 0218869 | 11/1985 | Japan ...................... 357/30 |
| 2180399 | 3/1987 | United Kingdom . |

OTHER PUBLICATIONS

Kempter, "A-Si:H Image Sensor: Some Aspects of Physics and Performance".
Kaneko et al., "Amorphous Si:H Contact Linear Image Sensor".
Ozawa et al., "Recent Development in Amorphous Silicon Image Sensor", all above in vol. 617, SPIE, Amorphous Semiconductors for Microelectronics (1986), pp. 120-139.
Kaneko, "Solid-State Image Sensor", in 21 Semiconductors and Semimetals, part D, pp. 139-159 (1984).

Primary Examiner—Brian E. Hearn
Assistant Examiner—Tuan Nguyen
Attorney, Agent, or Firm—George W. Moxon, II; Joseph G. Curatolo; Larry W. Evans

[57] ABSTRACT

An array for sensing the relative intensity of electromagnetic radiation at a plurality of locations employs a network of photodiodes and non-photoresponsive diodes. A first terminal of each photodiode, e.g. the anode, is electrically connected to a common point which is one terminal of the array. The non-photoresponsive diodes are connected in like-polarity series. The second terminal of each photoresponsive diode is connected to a different connection of non-photoresponsive diodes in the string. The array is scanned with a voltage ramp signal and each change in current flow indicates an illuminated diode. The particular voltage at which current flow changes discloses which photodiode is illuminated. Embodiments of the novel array can be made monolithically without a significant number of conductor cross overs. Monolithic embodiments of the array may be conveniently formed from monocrystalline semiconductors and thin films of amorphous and polycrystalline semiconductors such as amorphous silicon and electrodeposited cadmium telluride-containing semiconductors.

6 Claims, 4 Drawing Sheets

MAKING A PHOTORESPONSIVE ARRAY

This is a division of co-pending application Ser. No. 040,532 filed Apr. 7, 1987, now U.S. Pat. No. 4,785,191.

BACKGROUND

This invention concerns devices for sensing the relative intensity of electromagnetic radiation, such as light, at a number of locations and conversion of that information into electronic form for use in various apparatus. Examples of apparatus that can usefully incorporate such devices include photocopiers, facsimile transmitters, optical character readers and pattern recognition apparatus.

It is well known that an image on a document or other medium can be converted into electrical signals by illuminating the medium and measuring the amount of light reflected from, or transmitted through, each of a number of points on the image. Typically, a linear photoresponsive sensor is disposed a small distance from a document or image. The image is moved relative to the sensor as the sensor scans the image transversely to the direction relative motion, one line at a time. The photoresponse to the illumination is an electrical signal containing information indicative of the amount of light detected at numerous points along the scanned line. The electrical signal can be further processed to store or reproduce the image scanned in a modified or unmodified form, to transmit the information gathered from the image, to determine whether the information meets a test (pattern recognition) or denotes a known configuration (optical character reading).

Typical linear sensors operating in large format, i.e. over a large area, employ charge coupled devices or an array of photosensors. In large format applications, charge coupled devices require lenses, adding to the cost of the apparatus and introducing loss of optical resolution. In known arrays, each photosensor, usually a diode, is interrogated while or after it senses light intensity. Typically, the light intensity is determined by sensing changes in the electrical charge on each photosensor or on a capacitor connected in parallel with the photosensor. In general, the presence of light causes current flow and reduces the amount of stored charge. The amount of the stored charge that is lost is determined by measuring the quantity of charge required to restore the original charge. A separate component, such as a field effect transistor, is used to address each photosensor in each cycle or scan of the sensor. The field effect transistors themselves are typically connected to a shift register that collects the sensor data for further processing. These circuits are relatively complex since a separate switch is associated with each photoresponsive device and a shift register controls those switches. The switches, typically transistors, add a noise signal when they open and close that can be very troublesome since the signals sought to be detected are very weak. Moreover, the transistors have gate lengths of only a few microns. It is difficult to control accurately the positioning of a large number of these gates over a large area photosensor array using ordinary photolithography techniques.

The known photoresponsive arrays require a large number of connections to their shift registers. Many conductors must cross each other without being in electrical contact. This requirement means that either hybrid, i.e. not monolithic, circuits must be used to build the photosensor arrays, or a great number of conductor crossovers must be fabricated in a monolithic version. In a hybrid circuit array, electrical connections can be made by bonding wires to contact points so that the wiring is three dimensional, avoiding conductor crossovers. But assembly of hybrid circuits is not readily automated and is therefore expensive. The use of a large number of conductor crossovers in a monolithic circuit increases costs because extra processing steps are required and large numbers of crossovers adversely affect yield and reliability.

Examples of photosensitive arrays are disclosed in Dym and Hall U.S. Pats. Nos. 3,432,670 and 3,448,275. In the patent to Dym, pairs of diodes, one photoresponsive, one not photoresponsive, are connected in series. A number of the pairs are connected in parallel, separated by series connected resistors. The state of the photodiodes is determined by scanning the series-parallel array with a ramp voltage. As the ramp amplitude increases, each non-photoresponsive diode is forward biased in sequence. Each diode then remains forward biased until the end of the ramp is reached. The photoresponsive diodes are reverse biased by the ramp voltage. If any of the photodiodes are not illuminated only leakage current flows through them. As a result, they act like capacitors and store charge. The stored charge is retained until the photodiode is illuminated since no path for discharge is presented. Therefore, the residual voltages from the first voltage scan may distort all subsequent scans. This distortion might not be detrimental if the scanner senses only black and white images; but if a scanner is to sense a scale of greys intermediate to totally black and totally white states, then the residual charge will prevent accurate, reliable performance by the Dym scanner.

The Hall scanner is similar to that of Dym except that no monolithic embodiment is disclosed. Hall adds a capacitor across each photodiode which aids in detecting when the zero voltage point across the non-photoresponsive is reached. However, like the Dym scanner, the Hall scanner is susceptible to residual charge effects once the first voltage ramp has been applied since no current discharge path for unilluminated diodes is included.

Accordingly, what is needed is a photoresponsive array, preferably of monolithic construction, that is capable of coverting large area images into electrical signals, that does not require lenses, switches or a significant number of conductor crossovers and in which a scan of the sensors does not produce residual effects that adversely affect subsequent scans, so that black, white, and a multiple step gray scale image intensities can be detected.

SUMMARY OF THE INVENTION

The photosensitive array according to the invention can readily be manufactured monolithically without a significant number of conductor crossovers and does not require switches to interrogate its photosensors. By avoidance of the use of switches for each photosensor element, a potential source of noise and the difficulties of fabricating a large number of very small features of switch elements over a very large area are eliminated.

A photosensitive array according to the invention includes a plurality of photoresponsive devices such as photodiodes and a plurality of non-photoresponsive diodes. In a preferred embodiment of the invention, non-photoresponsive diodes are electrically connected in a like-polarity series string. One end of the string is a first terminal of the photo-responsive array. One of the photodiodes is disposed at each of the locations at which the illumination level, e.g. the intensity of incident light, is to be determined. The same terminal, for example the anode, of each photodiode is electrically connected to second terminal of the array. The other terminal of each of the photodiodes is electrically connected to a different one of the electrical junctions between the non-photoresponsive diodes in the series string. The state of illumination of each photosensor is determined by applying a voltage ramp signal to the array terminals and observing the current flows as the ramp signal voltage increases. Changes in current flow, indicating illumination, occur at voltages that correspond to the positions of the illuminated photosensors. From the current flows detected during application of the ramp signal, the desired illumination versus location information can be determined.

The novel photosensor array can readily be manufactured in monolithic form from thin films of polycrystalline or amorphous semi-conductors or from monocrystalline semiconductors. For example, embodiments of the novel array can employ thin film photoresponsive devices of amorphous silicon or cadmium telluride-containing (e.g. cadmium telluride, mercury cadmium telluride, etc.) compounds. It is advantageous to make an array employing cadmium telluride-containing heterojunctions because these heterojunctions have a strong response to the red spectral components of visible and near infrared light. The cadmium telluride-containing hetero-junctions may be electrodeposited on a prepared substrate having conducting regions. Single crystal silicon arrays can also be made in accordance with the invention. Regardless of the semiconductor used and its crystalline state, the arrays may be manufactured using known deposition and/or metallization technology. In some embodiments, the interconnections also act as masks for forming the non-photoresponsive diodes and photo-responsive diodes. These diodes may, in a single array, be all of the same type, e.g. junction diodes, or of different types, e.g. junction diodes and Schottky diodes.

DETAILED DESCRIPTION OF PREFERRED EMBODIMENTS

Figure 1:
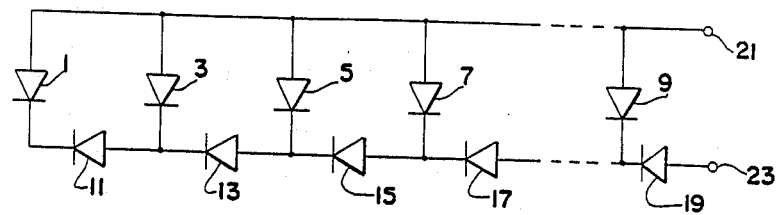
FIG. 1 is a schematic diagram of circuitry according to an embodiment of the invention.

Preferred embodiments, generally. In FIG. 1, a schematic diagram of a circuit of a photosensitive array according to an embodiment of the invention is shown. As used here, the term photosensitive means responsive to electromagnetic radiation. The invention disclosed is not limited to devices sensitive only to visible light. The embodiment of FIG. 1 includes a plurality of photoresponsive diodes, i.e. photodiodes, 1, 3, 5, 7 and 9, and a plurality of non-photoresponsive, i.e. conventional, diodes, 11, 13, 15, 17 and 19. As is conventional, the photodiodes and non-photoresponsive diodes each have two opposite polarity terminals, an anode and a cathode. The diodes conduct current far more readily when the anode is biased with a positive voltage with respect to the cathode than when the opposite polarity voltage is applied. In the embodiment of FIG. 1, the anodes of photodiodes 1, 3, 5, 7 and 9 are all electrically connected together to an electrically common point, 21, that forms one terminal of the arary. In FIG. 1, non-photoresponsive diodes 11, 13, 15, 17 and 19 are connected in like-polarity series, i.e. anode to cathode, anode to cathode, etc. With the exception of photoresponsive diode 1, and possibly diode 9, the cathode of each photo-responsive diode is electrically connected to the junction at which two of the non-photoresponsive diodes in the series-connected string are joined. Diodes 1 and 9 are disposed at opposite ends of the series-connected string. Therefore the cathode of diode 1 can be directly connected to only one of the non-photoresponsive diodes, diode 11.

In the embodiment shown in FIG. 1, there are an equal number of photoresponsive and non-photoresponsive diodes, the dashed lines indicating an omitted, unspecified number of such repeated diode pairs in the network. Therefore, the cathode of the last photoresponsive diode 9 can connect to a junction of two diodes in the eries connected string, provided the string includes diode 19. Non-photoresponsive diode 19 lacks the second of two photodiodes to which to be connected to and its anode forms a second terminal 23 of the array. Non-photoresponsive diode 19 is not essential to the embodiment shown in FIG. 1 and may be omitted. In that case, terminal 23 is the same electrical location as the anode of non-photoresponsive diode 17, which is also the same electrical location as the cathode of the final photoresponsive diode 9.

FIG. 1 is only one embodiment of circuitry according to the invention. The polarity of all the diodes in FIG. 1 (and in FIGS. 4A through 4D) can be reversed to form other embodiments of the invention. It is, however, important that a polarity convention be established and followed in a particular embodiment of the invention. As those skilled in the art appreciate, the appropriate polarity for the interrogating ramp signal for a particular embodiment of circuitry according to the invention depends on the diode polarity of that embodiment.

The diodes of FIG. 1, and of the other figures, may be junction diodes, Schottky diodes, metal-insulator semiconductor structures, back-to-back diodes, space charge limited diodes such as n-i-n amorphous silicon diodes or bulk barrier diodes such as n-p-n structures. It is important that the particular device used be electrically responsive to illumination and have a non-linear voltage current characteristic.

In use, for example, in a facsimile, photocopy or other apparatus, the array may be disposed in a straight line near a document. The array "scans" a line of the document then the array and document move relative to each other as successive lines are scanned. A light is shone on or through the document producing at each "line" an image that indicates, in its intensity, the brightness at points along the illuminated line. The array senses these intensities since, at applied voltages less than the open circuit voltage of the photoresponsive diodes, the current in each photodetector depends upon the intensity of light falling on it.

In order to convert the sensed light intensity at each point to an electrical signal, each photodiode in the array must be "interrogated" to determine the state of each photodiode. The interrogation may be carried out by applying a voltage ramp, i.e. a voltage signal monotonically increasing with time, to terminals 21 and 23 of the network. The polarity of the voltage is chosen so that the ramp signal forward biases the non-photoresponsive diodes and reverse biases the photodiodes. Because of the threshold potential of each of the non-photoresponsive diodes that must be overcome before current is conducted, the changes in the current that flows in response to the voltage ramp disclose the state (i.e. illumination level) of each photodiode. The voltages at which the current flow changes, if at all, each correspond to a specific position in the network where a diode is illuminated.

Unlike the known arrays discussed above, the novel array nearly always includes a path through which any residual charge can be dissipated between scans. Any photoresponsive diode that is at least partially illuminated will provide such a path. Stray light may be intentionally present to ensure the dissipation of residual charge between sequential applications of voltage ramps. Because each voltage scan of the novel array has a "fresh start" free of residual charge, a grey scale having, for example, 16 levels, can be detected by measuring not only the voltage "position" of current flow changes, but also the amount of the change in the current flow.

Figure 2A:
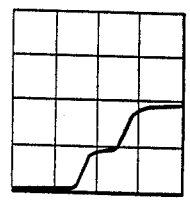
FIGS. 2A, 2B, 2C and 2D are examples of responses of a discrete element embodiment of the circuitry of FIG. 1 to voltage ramp signal.
Figure 2B:
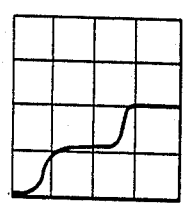
Figure 2C:
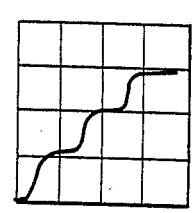
Figure 2D:
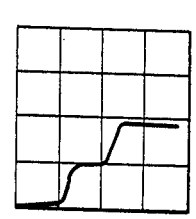

As an example of the response of the network, of FIG. 1 to a voltage ramp, measured responses of a network incorporating three discrete photodiodes and three discrete non-photoresponsive diodes measured on a curve tracer are shown in FIGS. 2A, 2B, 2C and 2D. The results are reported there with respect to the first diode pair, i.e. the pair least remote from the output terminals, the second pair, i.e. the pair of diodes next least remote from the network terminals, etc. In FIG. 2A, the first photodiode is not illuminated, while the other two photodiodes are illuminated. In FIG. 2B, only the second photodiodes is not illuminated; in FIG. 2C, all three photodiodes are illuminated; and in FIG. 2D, only the third photodiode is not illuminated. Clearly, when a particular photodiode is illuminated, there is a current change within a voltage range that discloses the position of the illuminated photodiode. The information thus gained can be processed in conventional electronics, stored, manipulated, and/or used to produce a desired result, e.g. an image on a page, a display on a monitor or stored data. The electronics may include a microprocessor to manipulate the information in a particular, preselected manner.

As already mentioned, the voltage at which a step increase in current occurs corresponds to a position along the array. The amount of the current increase may correspond to the light intensity at that position. In the absence of illumination the step increase in current is very small or non-existent. To improve array performance, it is preferred that each photo-responsive diode be illuminated at an intensity that is below the lowest intensity signal intended to be detected. With that limited background illumination, a small current step will be present at each photoresponsive diode in the array. That position information assists in confirming the presence or absence of a detected signal at each photoresponsive diode in the array as well as avoiding any unexpected residual charge storage effects.

Figure 3:
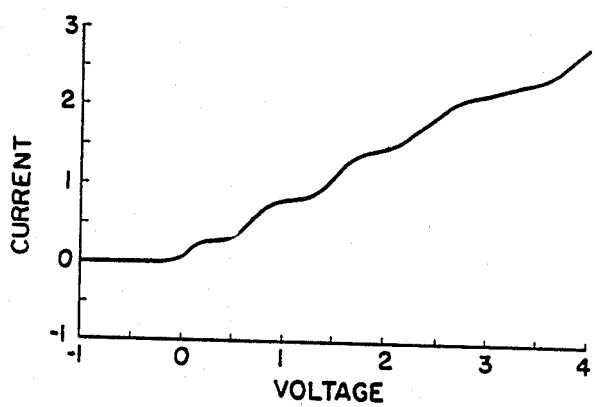
FIG. 3 is an example of a response to a monolithic embodiment of the circuitry of FIG. 1 to a voltage ramp signal.

In FIG. 3 the voltage-current response to a ramp voltage signal of a prototype monolithic embodiment of the invention is shown. In this embodiment the photodiodes are cadmium sulfide-cadmium telluride heterojunctions and are illuminated. The changes in current corresponding to illuminated diodes are readily discernible. The voltages at which the current flows change are not integer multiples of the first transition voltage probably because the internal resistances of the diodes in this particular prototype are larger than desired. FIG. 3 demonstrates that monolithic embodiments of the invention do function in accordance with this disclosure. The steps necessary to reduce the internal diode resistance are known.

The preceding description refers to scanning along a straight line. But the invention is not limited to straight line scanning. The diode pairs of FIG. 1 can be arranged in nearly any geometrical configuration so that the presence or absence of particular shapes in direct or reflected radiation can be detected. That is, the array is applicable not only to the apparatus already mentioned, but also to optical character readers, pattern recognition apparatus, etc.

FIGS. 4A, 4B, 4C and 4D depict alternate embodiments of the circuitry of FIG. 1. The embodiment of interconnected diodes of FIG. 1 is reproduced in each of FIGS. 4A, 4B, 4C and 4D with the changes described for each of those figures.

Figure 4A:
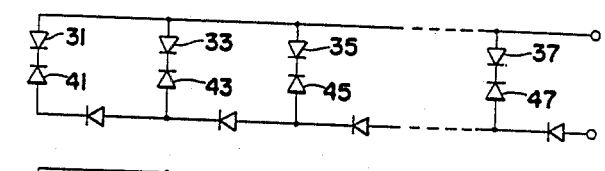
FIGS. 4A, 4B, 4C and 4D are schematic diagrams of circuitry according to additional embodiments of the invention.

In FIG. 4A, the photodiodes of FIG. 1 are modified. In FIG. 4A, photodiodes 1, 3, 5 and 9 are replaced by photodiodes 31, 33, 35, and 37, each of which has connected to it, in reversed-polarity series, a non-photoresponsive diode, 41, 43, 45 and 47, respectively. (Diodes 41, 43, 45 and 47 could be photoresponsive diodes that are shielded from light.) The relative positions of the non-photoresponsive diodes and photodiodes in FIG. 4A may be interchanged so long as the polarities of the diodes remain opposed. As with FIG. 1, the polarities of all the diodes in the embodiments of FIG. 4A may be reversed and the final non-responsive photodiode in each like-polarity series-connected string that is connected to an output terminal may be omitted. Each of diode pairs 31-41, 33-43, 35-45, 37-47, etc. can comprise two separate devices or they can be effectively merged, i.e. they may be replaced by a single device having two junctions that is called a bulk barrier diode.

Figure 4B:
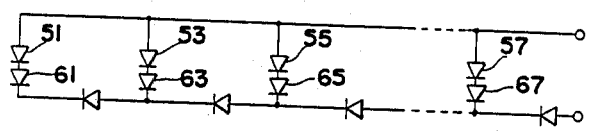

In the circuit of FIG. 4B, photoresponsive diodes 1, 3, 5 and 7 of FIG. 1 are replaced by a photoresponsive diode 51, 53, 55, and 57, and an extra photoresponsive diode 61, 63, 65, and 67, respectively, connected in like-polarity series. Because of the increased breakdown voltage added by the extra diodes, the maximum ramp voltage that can be applied is increased. This maximum ramp voltage increase means a longer network of diodes can be built, increasing the area that can be scanned and, for a given area, reducing the number of interconnections. In addition, the net capacitance of each photosensor is reduced since the series-connected diodes correspond to series-connected capacitors, i.e. have a total capacitance smaller than the capacitance of any of the series-connected diodes.

Figure 4C:
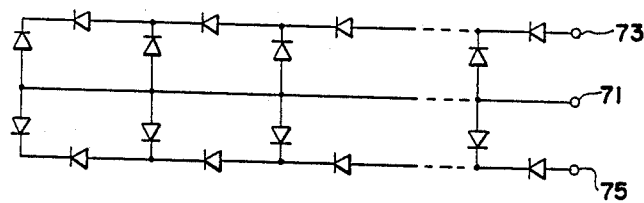

In FIG. 4C, a circuit for a more complex array is shown. The circuit comprises essentially two of the arrays of FIG. 1. Each of those separate arrays of FIG. 1 includes a terminal 23 and a common terminal 21, terminal 21 being connected to the anodes of the photo-responsive diodes. The circuit of FIG. 4C is formed by connecting the common anode terminals 21 of two arrays to form a common terminal 71. The other terminals 23 of the separate arrays become terminals 73 and 75 of the more complex array, To scan the complex circuit of FIG. 4C, separate voltage ramp signals are applied to terminals 73 and 75 of the circuit. That is, one voltage ramp signal is applied across terminals 73 and 71 and another voltage ramp signal is applied across terminals 75 and 71 in order to interrogate the two interconnected arrays of FIG. 4C. Obviously, additional diode networks can be connected so as to have the same common terminal 71.

The circuitry of FIG. 4C, if linearly disposed, can scan two adjacent lines, i.e. linearly disposed sets of locations, simultaneously; that is, it can determine the relative light intensities at each of a number of locations disposed along each of two adjacent lines. As noted above, it is not necessary that the photodiodes be arranged in a straight line; they can be disposed along any path that produces a desired result by detecting the relative illumination at each of a number of locations. The circuitry of FIG. 4C can aid in changing or increasing the area and number of locations that can be scanned. In any one of these arrays it may be desirable to use identical diodes throughout. That is, the diodes may all be photoresponsive diodes, but some of the diodes, e.g. diodes 11, 13, 15, 17 and 19 of FIG. 1, are shielded from light so that they behave as non-photoresponsive diodes.

Figure 4D:
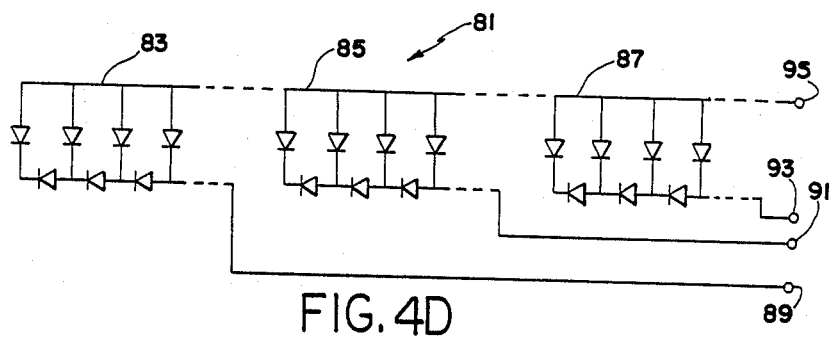

For various reasons, e.g. to avoid exceeding diode breakdown voltage in the scanning ramp, it may be desirable to limit the maximum voltage that is applied to a network. This limit means that the number of photodiodes in a network also is limited. An embodiment of the invention for scanning the illumination intensities at a very large number of points, e.g. a wide document, is depicted in FIG. 4D.

There, a network 81 comprises several arrays 83, 85 and 87, each of the type earlier described with respect to FIG. 1, disposed end-to-end along a line to cover the length desired. As indicated in FIG. 4D, each of arrays 83, 85, 87 can be scanned with a separate voltage ramp simultaneously, increasing scanning speed over that which would be attained with a single, very long network. The state of illumination along network 81 is directly readout by applying separate ramp voltages across terminals 89, 91 and 93, respectively, and the common terminal 95.

Figure 5:
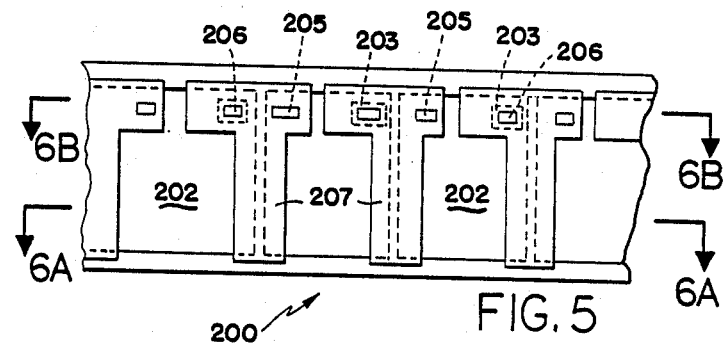
FIG. 5 is a plan view of a monolithic, monocrystalline embodiment of a photoresponsive array according to the invention.
Figure 6A:
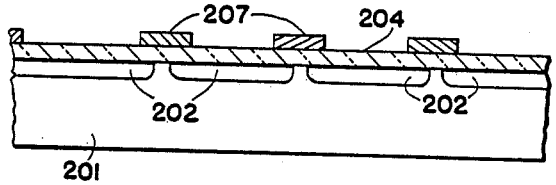
FIGS. 6A and 6B are sectional views taken along lines 6A—6A and 6B—6B, respectively, of FIG. 5.
Figure 6B:
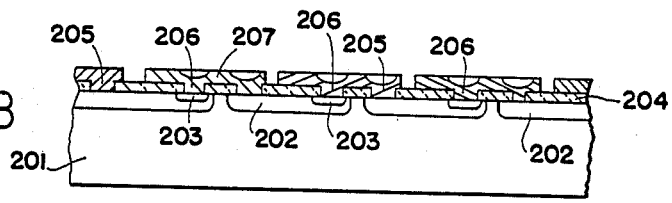

Monocrystalline Embodiment. Embodiments of the novel photo-responsive array can be prepared on monocrystalline silicon substrates using conventional integrated circuit technology. An example of such an embodiment 200 is shown in FIG. 5 in plan view and in FIGS. 6A and 6B in sectional views. None of these figures are to any scale and dimensions have been intentionally distorted for clarity of explanation.

Embodiment 200 includes a silicon substrate 201 that may be n-or p-type. For this discussion, an n-type substrate 201 is assumed, although all the conductivity types in the example could be reversed. By sequential deposition of oxide layers, formation of holes in each layer, diffusions or depositions through the holes, followed, in some cases, by removal of the oxide layer, the desired patterns of diodes and diode interconnections can be established. The steps all employ conventional oxidation, photolithography, etching and deposition processes. For example, in a first processing sequence, a layer of silicon dioxide (not shown) is deposited on the substrate and windows opened in that oxide to form a diffusion mask. By known diffusion processes, opposite conductivity, p-type here, regions 202 are diffused into substrate 201 through the windows in the first silica mask. Each of these regions forms a p-n junction with the substrate that is one of the photoresponsive junctions of the array. The silica layer containing the duffusion windows is closed by more silica or, preferably, the silica is etched away. Thereafter, a second layer of a transparent, electrical insulator, such as silicon dioxide, is deposited or formed on the surface of substrate 201. Windows are opened in that second layer as a diffusion mask. A dopant, n-type here, producing the same conductivity type as the substrate is diffused through these windows to form regions 203. Regions 203 form photoresponsive p-n junctions with regions 202. The second oxide layer is preferably removed and the substrate is covered with a third oxide layer, 204. By conventional masking and etching techniques, contact openings 205 and 206 are opened in oxide layer 204. Each opening 205 provides access to one of regions 202. Each opening 206 gives access to one of regions 203. A metallic layer, such as aluminum, is deposited over the top surface of the device and formed into a pattern of islands 207. Islands 207 interconnect the diodes and shield the non-photoresponsive diodes from light. The pattern may be formed by conventional masking and etching or the lift-off technique may be used. In the latter case, the photoresist is deposited over the entire surface and removed when the subsequently deposited layer is to remain. After that subsequently deposited layer is in place, the underlying photoresist is dissolved, lifting off any overlying layers.

The resulting monolithic array includes large-area photo-responsive diodes all having a common cathode, which is substrate 201. The non-photoresponsive diodes are electrically isolated from substrate 201 by regions 202. The anode of a photoresponsive diode is connected to, in fact is, the anode of a non-photoresponsive diode. The cathode 203 of each non-photoresponsive diode is electrically connected by one of islands 207 through one of openings 205 to the anode of the next non-photoresponsive diode, i.e. the adjacent region 202. That is, the non-photoresponsive diodes are connected in series and are shielded from light by islands 207.

Obviously, a number of rows of embodiment 200 could be disposed on a single substrate so that several lines could be scanned simultaneously. As mentioned above, the rows need not be a straight line, but could be disposed along a curve, a polygon or other closed figure, for example, simply by using appropriate masks in the processing technology.

Polycrystalline Embodiment. An important advantage of the photoresponsive array is the ability to make embodiments of it monolithically from thin films. It is particularly advantageous to make polycrystalline, thin film embodiments. These embodiments can employ diodes of cadium sulfide-cadmium telluride or cadmium sulfide-mercury cadmium telluride heterojunctions. These heterojunctions are particularly sensitive to light in the red portion of the visible and near infrared light spectrum. This spectral sensitivity is particularly desirable when ordinary artificial light sources are used to illuminate an image, e.g. in a photocopier, facsimile apparatus, optical character reader, or pattern recognition apparatus, that is scanned to convert the image into electrical signals.

Figure 7A:
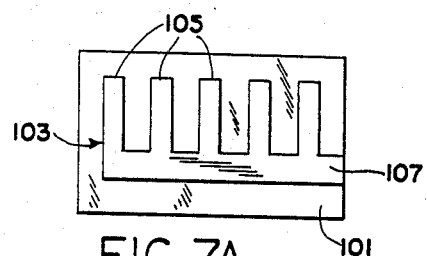
FIGS. 7A through 7D are an illustration of the steps in a process of making the circuitry of FIG. 1 monolithically according to the invention.
Figure 8:
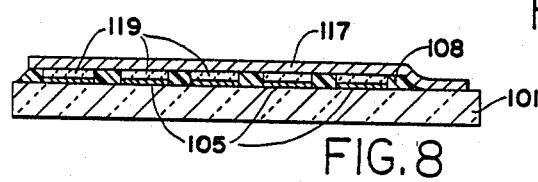
FIGS. 8 and 9 are sectional views of the embodiment of the invention shown in FIG. 7D taken along lines 8—8 and 9—9, respectively.
Figure 9:
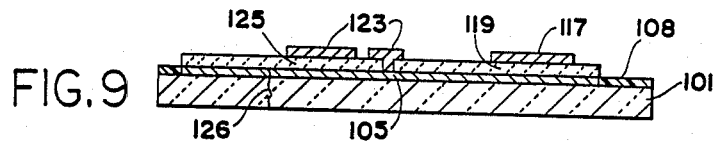

The steps in one method, according to the invention, for fabricating an embodiment of the circuitry of FIG. 1 are illustrated in FIGS. 7A through 7D. FIGS. 8 and 9 are sectional views taken along lines 8—8 and 9—9 of FIG. 7D to aid understanding of the structure. The following illustration is particularly applicable to, but not limited to, cadmium telluride-containing (i.e. containing a film of CdTe or HgCdTe) heterojunction diodes. In FIG. 7A, an electrically insulating substrate 101 has deposited on it a pattern of conductors 103. The substrate is preferably light-transmissive, such as glass. Alternatively, the substrate may be opaque naturally or may be coated with an opaque material. Conductors 103 are preferably disposed on an uncoated side of the substrate. When the substrate is light-transmissive the electrically conducting material 103 is preferably transparent such as a transparent oxide, like tin oxide, indium tin oxide, cadmium tin oxide, zinc oxide, etc., as are known in the art. The electrical conductors 103, whether an opaque material such as a metal film or a transparent oxide, may be deposited by conventional techniques such as sputtering, evaporation and condensation, and plasma or chemical vapor deposition. The pattern may be formed by conventional techniques such as photoresist masking and etching to remove unwanted conducting areas and to leave the desired pattern in place.

Conducting pattern 103 has two major components. Each of a plurality of fingers 105 extends from a bus bar 107. It is particularly important that bus bar 107 be present if semiconductor material is to be electrodeposited since fingers 105 act as an electrode in that process. When cadmium telluride-containing diodes are used, cadmium sulfide is initially deposited. Various techniques for depositing cadmium sulfide such as plasma spraying and electrodeposition are known in the art. The preferred cadmium sulfide deposition process is electrodeposition since in that process the conducting pattern 103 acts as an electrode and confines the deposition to the conducting pattern.

Once the cadmium sulfide layer is disposed on the conducting pattern, a layer of cadmium telluride or mercury cadmium telluride, i.e. $Cd_xHg_{1-x}Te$ where x ranges from greater than zero to no more than one, is deposited on the cadmium sulfide, preferably by an electrodeposition technique. Methods of electrodepositing cadmium telluride are disclosed in U.S. Pats. Nos. 4,400,244 and 4,425,194. A method of depositing cadmium-rich mercury cadmium telluride is disclosed in U.S. Pat. No. 4,548,681. As deposited, these cadmium-containing compounds generally show n-type conductivity, the same as cadmium sulfide, and therefore do not form rectifying heterojunctions. However, by heat treating the cadmium telluride, as disclosed in U.S. Pat. No. 4,388,483, the conductivity of the cadmium telluride can be converted to p-type so that good quality photovoltaic diodes can be made. The disclosures of all the U.S. patents mentioned in this paragraph are incorporated herein by reference. Electro-deposition is the preferred cadmium telluride deposition process because the deposited layer is confined to conductive pattern 103.

It is desired that a photoresist be applied to substrate 101 as an insulator, to support the metallization that is to be applied later and to prevent short circuiting at the edges of the metallization. Preferably, with a light transmissive substrate, a negative photoresist is applied to the side of substrate 101 on which fingers 105 are deposited. The photoresist is exposed to light from the reverse side of substrate 101 so that it becomes insoluble between fingers 105 and in any pinholes in the electrodeposited layer that reach substrate 101. Thereafter, the soluble, i.e. unexposed, photoresist is removed with an appropriate developer. The insoluble photoresist is left in place between the fingers and in any pinholes. The areas of photoresist that remain on substrate 101 between fingers 105 are indicated at 108 in FIG. 7B.

Figure 7B:
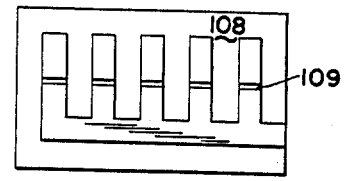
Figure 7C:
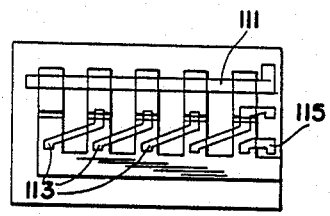
Figure 7D:
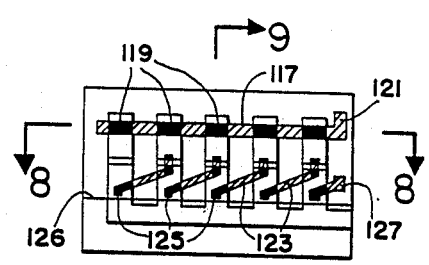

A groove 109 is cut into the deposited semiconductor layers across fingers 105 as best seen in FIG. 7B. Groove 109 may be cut by mechanical scratching, by laser scribing or by chemical etching, for example. In any case, in cutting groove 109, the electrical conductivity of fingers 105 is not interrupted. Groove 109 interrupts the continuity of the semiconductor layers, exposes fingers 105 for making electrical contacts to conductors 105, and defines a pair of discrete diodes on each of fingers 105. After groove 109 is cut, the electrical interconnection is completed using the photolithographic lift-off technique already described. A positive photoresist is applied to the entire surface on the side of substrate 101 that bears the deposited layers. The photoresist is illuminated through a mask so that only the areas that define interconnections 111, 113 and 115, as shown in FIG. 7C, are exposed. The exposed photoresist is removed with an appropriate solvent. Thereafter a metal, such as nickel, is evaporated and a film of the metal is condensed on the coated surface of substrate 101. The metal adheres both to the exposed areas of the semiconductor layers and to the remaining photoresist. That remaining photoresist is dissolved so that the metal layer is lifted off all areas, except 111, 113 and 115. As seen in FIG. 7D, the metal (indicated by diagonal lines) adheres to the remaining areas 111, 113 and 115. The metal forms contacts or the metal electrode of Schottky barrier diodes and also forms electrical interconnections. One area of the adherent metal forms a metal strip 117 on area 111. Strip 117 connects one electrode of each of a plurality of diodes 119 disposed under strip 117 to a terminal 121 of the array. (The diodes are indicated in FIG. 7D by the solid areas.) A plurality of metal strips 123 covering areas 113 forms the series interconnection of the non-photoresponsive diodes 125 disposed under strips 123. A metal strip 127 projects outward from the last of fingers 105 and forms another terminal of the array. It is important in this embodiment that the metal deposited adhere in at least the part of the groove 109 along each strip 123 which is included in area 113. Each of metal strips 123 must extend into the groove and contact the underlying conductive layer 105 on substrate 101. This contact interconnects the series-connected non-photoresponsive diodes 125 with the parallel-connected photoresponsive diodes 119 in the fashion illustrated in FIG. 1. This interconnection is apparent in the sectional view of FIG. 9. The support provided to metal strip 117 by developed photoresist is shown in the sectional view of FIG. 8. The method of preparing an embodiment of the photoresponsive array just described is particularly useful. Although there are a number of masking and etching steps in the method, only the masking step to define interconnect areas 111, 113 and 115 requires a mask alignment.

Busbar 107 is removed by breaking off the edge of the substrate along line 126 after scribing it. Alternatively, the short circuiting effect of busbar 107 may be removed by isolating the busbar by scribing a line through it mechanically, with a laser or by chemically dissolving at least part of it.

In the process just described, all the diodes produced, i.e. diodes 119 and 125, are photoresponsive. In order to make diodes 125 non-photoresponsive, they must be shielded from light. The shielding can be a light-opaque material applied to substrate 101 on the side opposite the coatings. The shield can be an opaque adhesive tape, a paint or other material. It may be desirable to apply an opaque material to substrate 101 either on the side to be coated, before fingers 105 are deposited, or on the opposite side of the substrate. An opaque layer on the coated side of substrate 101 helps avoid internal reflections that can transmit to the non-photoresponsive diodes light that enters the uncoated side of the substrate. An opaque layer on the coated side of substrate 101 may be a metal film from which a part of fingers 105 are formed. If the opaque film is not an electrical conductor, then fingers 105 are separately formed on top of it from another transparent or opaque electrically conducting film.

Amorphous Semiconductor Embodiment. An embodiment of the novel array can also be fabricated from amorphous silicon. With the exception of the steps described below, much of the processing and the resulting structure is similar to that shown in FIGS. 7, 8 and 9, and is therefore described with reference to them.

In an amorphous silicon embodiment, a substrate 101 would be initially coated with an electrical conductor, such as a transparent conductor like indium tin oxide. If it is desired to obscure parts of a light transmissive ITO-coated substrate from light, then those areas could be coated with molybdenum, chromium or some other opaque, electrically conducting material using conventional techniques. Thereafter, amorphous silicon is deposited, preferably by the glow discharge technique. Since this plasma deposition process is not confined to any one area of the substrate, fingers 105 are not formed before the semiconductor material is deposited. By known techniques, a photoresponsive layer containing sequentially deposited n-type, intrinsic and p-type strata are deposited. A typical structure might have doped strata, each 20 nanometers in thickness, between which a 700 nanometer thick intrinsic layer of amorphous silicon is disclosed. Either the p-type or n-type layer can be deposited fingers in the sequence. As is understood in the art, "intrinsic" amorphous silicon is normally slightly n-type unless intentionally doped. Even lightly doped material is referred to as intrinsic. It is also known that the effective band gap energy of amorphous silicon can be increased by incorporating carbon or nitrogen and created by incorporating germanium. Devices incorporating all these variations are generally referred to here as amorphous silicon diodes.

After the amorphous silicon is deposited, fingers 105, without busbar 107, can be formed by masking and etching. The technique described above using negative photoresist and illumination through the substrate can be employed to cover edges and fill pinholes to avoid short circuits. Otherwise, a positive photoresist with direct illumination may be used. Thereafter the techniques described for FIGS. 7, 8 and 9 are employed, except for disconnection of the busbar, to complete the amorphous silicon array.

Figure 12:
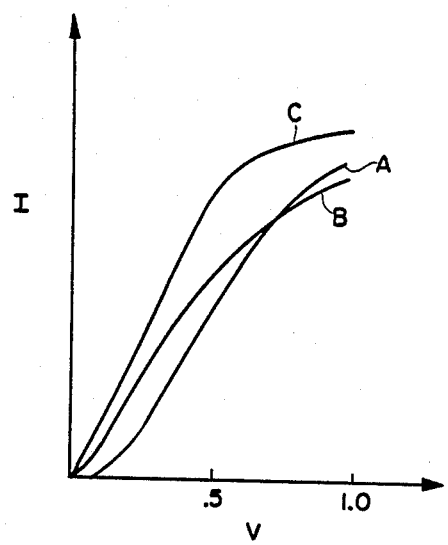
FIG. 12 is a graph of a voltage-current relationships of diodes including amorphous silicon that may be used in an embodiment of the invention.

As an alternative, by omitting the uppermost doped layer, the metal contact layer to the amorphous silicon may form a Schottky barrier or MIS diodes can be prepared. Gold, nickel, platinum, or a gold-palladium alloy are good choices for making these sorts of diodes in lieu of junction diodes. In FIG. 12 the measured voltage-current relationship so three diodes including amorphous silicon that may be used in the novel array are graphed. Curve A is the response of a p-i-n amorphous silicon diode. Curves B and C are responses of Schottky barrier diodes having a gold contact on an "intrinsic" layer on top of an n-type layer. In the diode of curve B, the intrinsic layer, in undoped, whereas the diode in curve C has a lightly doped n-type "intrinsic" layer. Of these responses, characteristic C is the preferred one for the photoresponsive array, since for a given current it represents the smallest voltage drop. Thus for a selected scanning voltage, the diode of curve C could supply the most current for a given illumination intensity. Said another way, curve C minimizes the voltage that must be applied in order to obtain a particular current response.

Figure 10:
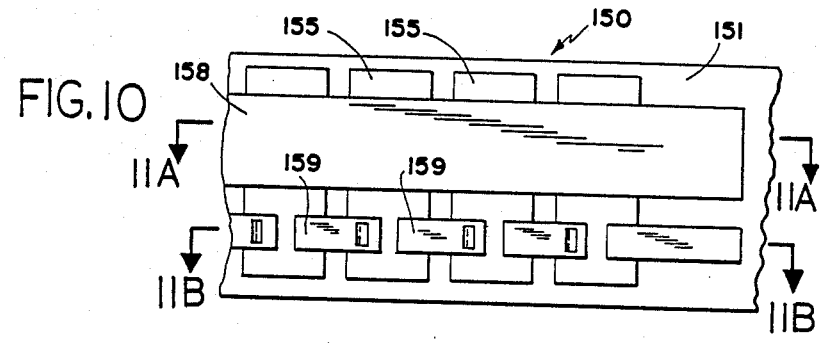
FIG. 10 is a plan view of a monolithic, thin film embodiment of a photoresponsive array according to the invention.
Figure 11A:
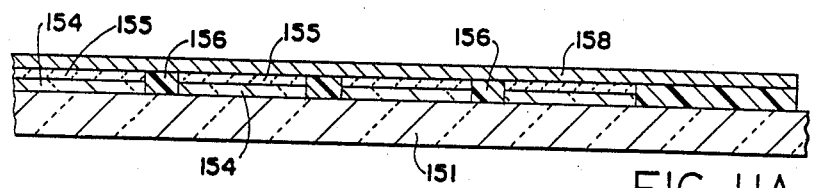
FIGS. 11A and 11B are sectional views taken along lines 11A—11A and 11B—11B, respectively, of FIG. 10.
Figure 11B:
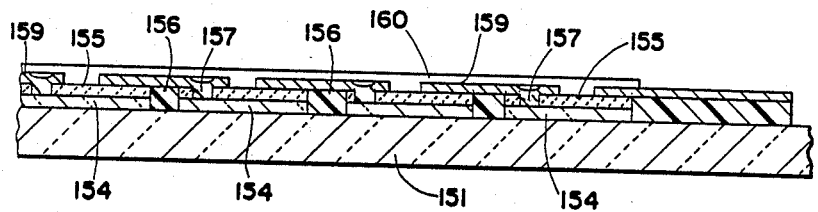

An alternative embodiment, 150 of a thin film amorphous silicon array according to the invention is shown in plan view in FIG. 10 and in section in FIGS. 11A and 11B. A substrate 151, which may be transparent, such as glass, has a thin electrically conductive layer deposited on it. If the photodiodes in the array are to be illuminated through the substrate, that electrically conductive layer must be transparent, such as indium tin oxide. As already described, it may be desirable to add light shields, such as chromium or molybdenum, over parts of the coated substrate so that some of the subsequently deposited diodes are effectively non-photoresponsive. Whether or not light shields are first applied, a thin film of amorphous silicon is deposited on the earlier-deposited, thin electrically conductive layer. As explained above, the amorphous silicon film may contain various strata of different conductivity types forming photoresponsive junctions. Alternatively, Schottky barriers or MIS diodes may be formed with a subsequently deposited metal layer. Thereafter, the deposited semiconductor film and underlying conducting layer are formed into the islands 154 of transparent conductive oxide and islands 155 of semiconductor as shown in FIGS. 10 and 11. Conventional photoresist techniques are used to define the islands and remove the intervening material. Photoresist or silica 156 may be deposited between islands 154 and 155 to support subsequent deposited metallization and thereby avoid short circuits. Photoresist may also fill pinholes to avoid short circuits.

In order to connect the non-photoresponsive diodes in series, an aperture 157 is opened in each of islands 155 giving access to the transparent conductive islands 156. An electrically conducting layer is then deposited to establish those series electrical connections. The electrically conducting layer may be supported between islands 154 and 155 by photoresist, silicon dioxide or another insulator 156. If the photoresponsive diodes are not to be illuminated through the substrate, the electrically conductive layer must be transparent, such as an electrically conductive oxide, as shown in the figures. Otherwise, the layer may be opaque, such as a metal for contacting the amorphous thin film PIN diodes or for making the metal part of a Schottky barrier or part of MIS diodes. The electrically conducting layer is formed into a broad stripe 158 that interconnects one terminal of each photoresponsive diode, and a plurality of discontinuous narrow stripes 159, that provide the series connections of the non-photoresponsive diodes. Narrow stripes 159 contact islands 154 by means of holes 157 so that the top layer of one non-photoresponsive diode is electrically connected to the bottom layer of the next adjacent non-photoresponsive diode. This metallization establishes the desired series connection. Conductors 158 and 159 can be preferably defined from the conducting layer by the lift-off technique described above. Stripe 158 is one terminal of the array and projects beyond it for an external connection. The last of stripes 159 likewise is extended for establishment of an external connection. Stripes 159 normally do not short circuit the junctions within the islands or between islands 154 and 155 because of the high lateral resistance of the preferred, very thin amorphous silicon film, e.g. a film less than 1 micrometer in thickness as described above. If a particularly low resistivity film is used, e.g. a microcrystalline film, so that short circuits are possible, interconnections of the type conventionally used with monocrystalline devices may have to be employed. The commonality of islands 155 provides the necessary interconnection of the photoresponsive and non-photoresponsive diodes. Finally, with transparent top conductors, an opaque layer 160 (shown only in FIG. 11B for clarity) is deposited over and beyond narrow stripes 159 to shield the underlying diodes from light directed at the top of the array.

An embodiment of an amorphous silicon array having the circuitry of FIG. 4B can be made in a processing sequence similar to that described above. The stack of series-connected photoresponsive diodes can be easily prepared using the technique employed with amorphous silicon solar cells. In that monolithic technique, the top contact of one cell is electrically connected to the bottom layer of the next adjacent cell to establish a series connection. Any number of cells can be connected in series using this arrangement. The remainder of the circuit, including the photoresponsive to non-photoresponsive diode interconnections, can be made as already described for the other amorphous silicon array embodiments.

While FIGS. 5 through 11 emphasize single, straight line arrangements of the photodiodes in an embodiment of the novel array, it is obvious from the description that numerous geometrically different arrangements can be readily prepared. However, FIGS. 5-11 illustrate important advantages of the invention. These embodiments show no conductor crossovers. Crossovers occur in monolithic circuits where two conductors must cross, but not intersect, i.e. must be electrically insulated from each other. Crossovers require additional processing steps in which insulators are deposited between metallization steps to establish the necessary electrical isolation. These extra processing steps increase the risk of error and reduce yield. In addition, crossovers are frequent sources of failure because of inadequate, defective or failing insulatinn between the crossing conductors. Known line scanners typically include about 50 photosensitive diodes per unit and require several units to scan a line. These scanners require hundreds or thousands of conductor crossovers. As the preceding description and FIGS. 5-11 show, embodiments of photosensitive arrays according to the invention have far fewer conductor crossovers. The reduction in crossovers in the novel arrays substantially simplifies fabrication, reduces cost and improves reliability compared to known line scanners. The novel arrays avoid the use of transistor switches, since each array is interrogated in a single voltage ramp sweep. The absence of switching reduces noise, meaning improved signal sensitivity. In addition, the problem of accurately locating small transistor elements over a large area is avoided. Therefore, a higher density of array diodes may be achieved. As a result, a smaller area diode array or the same size array, that is photosensitive at locations covering a larger area compared to arrays that incorporate transistors, can be produced according to the invention. Since the novel arrays can easily be arranged end-to-end and side-by-side, and each array interrogated separately, a large area can be scanned in a short time by employing several of the novel arrays and applying a voltage scanning ramp to each of the arrays simultaneously. The current changes indicating illuminated areas of an array can be detected inductively or with known current rate of change detectors. Preferably, a background light intensity is present to give a positive indication of each sensor position and to eliminate any possibility of interference between sequential array scans.

The invention has been described with particular attention to certain preferred embodiments. Various additions and modifications within the spirt of the invention will occur to those of skill in the art. Therefore, the scope of the invention is limited solely by the following claims.

I claim:

1. A method for making a monolithic array for sensing the relative intensity of electromagnetic radiation at each of a plurality of locations comprising:
   depositing a layer of semiconductor material on an electrically conducting layer disposed on an electrically insulating substrate;
   removing portions of said layers to form at least two fingers each comprising a conducting layer covered by a semiconductor layer;
   defining two discrete photoresponsive semiconductor devices on each of said at least two of said fingers;
   depositing an electrically conducting material on one of said discrete devices on each of said at least two fingers and therebetween to interconnect said first discrete devices electrically in parallel at one of their terminals and to form a first terminal of the array; and
   depositing an electrically conducting material on the other of said discrete devices on each of said at least two fingers, on a different one of said at least two fingers and therebetween to interconnect said second discrete devices electrically in series, a terminal of one of said second discrete devices forming a second terminal of the array.

2. The method of claim 1 including depositing a layer of amorphous silicon as said semiconductor material.

3. The method of claim 1 including defining said pair of discrete devices by cutting a groove across each of said fingers in said semiconductor structure extending to, but not severing, said electrically conducting material forming said fingers.

4. The method of claim 1 including defining said pair of discrete devices by disposing a second mask on said semiconductor structure to protect two areas on each of said at least two fingers and removing the semiconductor material that is not protected by said second mask.

5. The method of claim 4 including disposing an electrically conducting material as said mask to form said second mask pattern and parallel electrical interconnection simultaneously.

6. The method of claim 4 including disposing an electrically conducting material as said mask to form said second pattern and at least part of said series electrical interconnection simultaneously.

* * * * *